United States Patent
Haes et al.

(10) Patent No.: US 10,474,142 B2
(45) Date of Patent: Nov. 12, 2019

(54) DETECTION OF CROSS-COUNTRY FAULTS

(71) Applicant: Schweitzer Engineering Laboratories, Inc., Pullman, WA (US)

(72) Inventors: Dennis Haes, Colfax, WA (US); Normann Fischer, Colfax, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 302 days.

(21) Appl. No.: 15/718,145

(22) Filed: Sep. 28, 2017

(65) Prior Publication Data
US 2019/0094845 A1   Mar. 28, 2019

(51) Int. Cl.
| | |
|---|---|
| H02H 7/00 | (2006.01) |
| G05B 23/02 | (2006.01) |
| H02H 1/00 | (2006.01) |
| G01R 19/25 | (2006.01) |
| G01R 31/02 | (2006.01) |

(52) U.S. Cl.
CPC ..... *G05B 23/0205* (2013.01); *G01R 19/2513* (2013.01); *G01R 31/024* (2013.01); *H02H 1/0007* (2013.01)

(58) Field of Classification Search
None
See application file for complete search history.

(56) References Cited

U.S. PATENT DOCUMENTS

| | | | | |
|---|---|---|---|---|
| 6,718,271 B1 * | 4/2004 | Tobin | ............ | G01R 31/024 |
| | | | | 324/521 |
| 7,660,088 B2 * | 2/2010 | Mooney | ............ | H02H 3/283 |
| | | | | 361/63 |
| 7,728,600 B2 * | 6/2010 | Wahlroos | ............ | G01R 31/088 |
| | | | | 324/500 |

\* cited by examiner

*Primary Examiner* — Stephen W Jackson
(74) *Attorney, Agent, or Firm* — Jared L. Cherry

(57) ABSTRACT

Disclosed herein are a variety of systems and methods related to detection of a cross-country fault in an electrical power system. In one embodiment, a system consistent with the present disclosure may be configured to monitor electrical parameters in the electrical power system. The system may determine when a voltage magnitude of one phase exceeds a first voltage threshold. The one phase that exceeds the first voltage threshold may be identified as an un-faulted phase. The system may further be configured to determine that the voltage magnitude of the un-faulted phase exceeds a second threshold based on a zero-sequence voltage. The system may further be configured to determine that a phase angle between the un-faulted phase and the zero-sequence voltage is within a range. A protective action to clear the cross-country fault condition may be implemented upon identification of a cross-country fault.

20 Claims, 6 Drawing Sheets

DETECTION OF CROSS-COUNTRY FAULTS

TECHNICAL FIELD

This disclosure relates to detecting a fault in an ungrounded electric power delivery system. More particularly, but not exclusively, this disclosure relates to techniques for detecting a cross-country phase-to-phase-to-ground fault in an ungrounded electric power system.

BRIEF DESCRIPTION OF THE DRAWINGS

Non-limiting and non-exhaustive embodiments of the disclosure are described, including various embodiments of the disclosure, with reference to the figures, in which.

DETAILED DESCRIPTION

Figure 1:
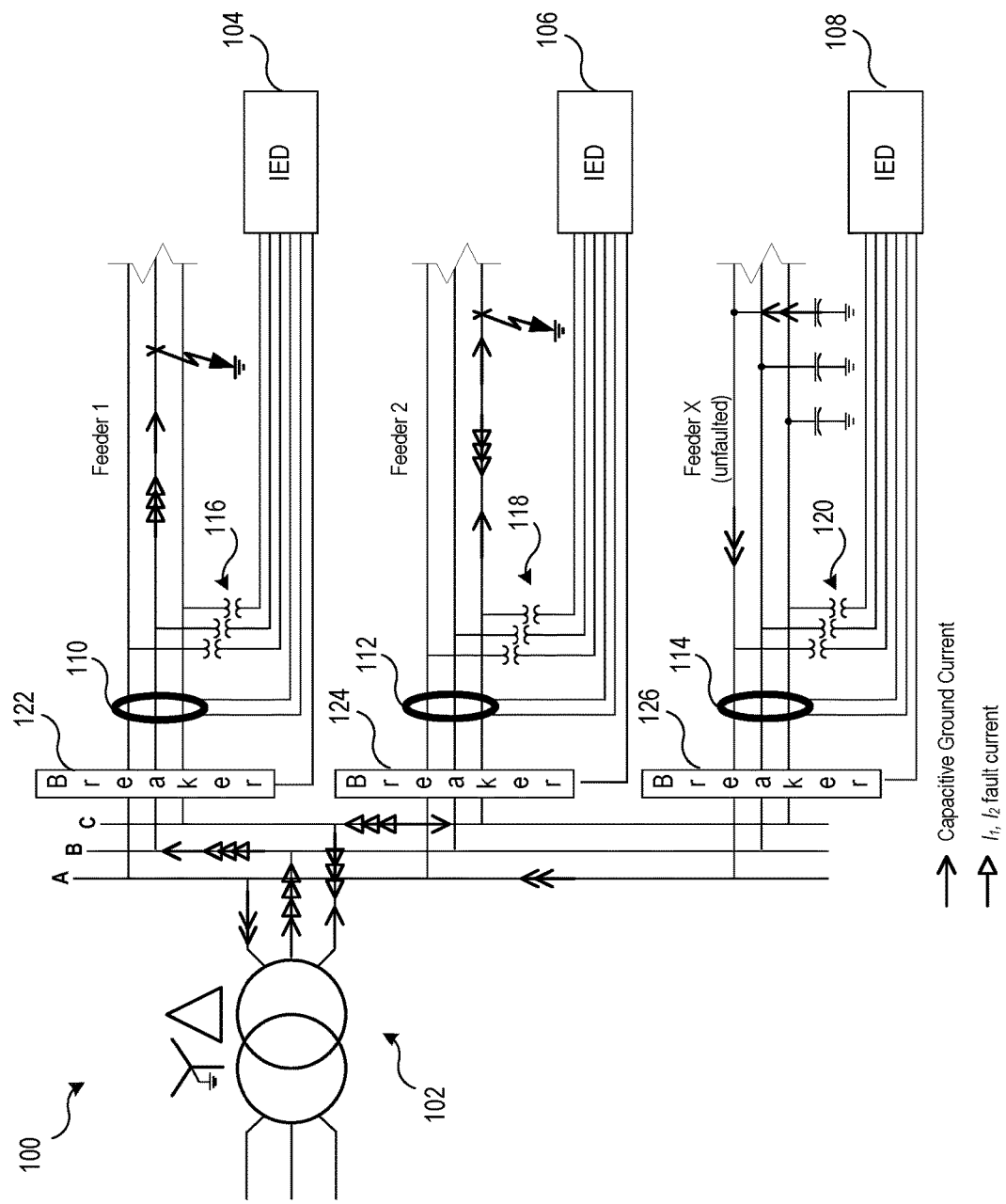
FIG. 1 illustrates a diagram of a portion of an electric power system monitored by an IED and configured to detect a cross-country fault consistent with embodiments of the present disclosure.

The present disclosure pertains to detection of cross-country electrical faults in an ungrounded electric power system. The term "cross-country fault" may refer to multiple faults in an electric power system at different locations. In some cases, the locations may be widely separated. As such, there may be significant impedance between the fault locations. The potentially large separation between the fault locations and the potentially large impedance between the fault locations may make it difficult to identify cross-country faults using typical protection schemes. Systems and methods consistent with the present disclosure may evaluate electrical conditions and detect certain conditions indicative of a cross-country fault. Such systems may implement remedial action to address the cross-country fault. Further, such systems may block certain ground fault protection schemes upon the detection of criteria indicative of a cross-country fault.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described will be illustrated as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic and/or processor executable instructions.

FIG. 1 illustrates a diagram of a portion of an electric power system 100 monitored by an IED 104 and configured to detect a cross-country fault consistent with embodiments of the present disclosure. The systems and methods disclosed herein may be configured to differentiate between the cross-country faults and other types of faults, such as a phase-to-ground fault or a phase-to-phase-to-ground fault based on electrical conditions detected by IEDs 104, 106, and 108. A source (not shown) may be connected to a wye-delta transformer 102 that supplies electrical energy to three phases (i.e., phases A, B, and C). System 100 is configured to operate in an ungrounded configuration. Electrical power from system 100 may supply a plurality of loads (not shown) in electrical communication with the electrical energy.

A plurality of current sensors and voltage sensors may monitor electrical conditions in system 100, and may provide information about the electrical conditions to IEDs 104, 106, and 108. Current sensors 110, 112, and 114 may monitor currents flowing through Feeder 1, Feeder 2, and Feeder X, respectively. The current sensors 110, 112, and 114 may, in some embodiments, comprise summation current transformers. Voltage sensors 116, 118, and 120 may monitor voltages in Feeder 1, Feeder 2, and Feeder X. According to some embodiments, current sensors 110, 112, and 114 and/or voltage sensors 116, 118, and 120 may connect to an input module configured to create digitized representation of current and voltage measurements. IEDs 104, 106, and 108 may analyze the current and voltage measurements provided by the current and voltage sensors to detect and remediate faults in system 100, including cross-country faults.

In the illustrated embodiment, a cross-country fault has occurred on feeder 1 and feeder 2. The fault on feeder 1 is a fault from phase B to ground and the fault of feeder 2 is from phase C to ground. The fault currents, $I_1$ and $I_2$ are shown, along with the "measured" zero-sequence current, $I_0$. The "measured" zero-sequence currents do not solely consist of zero-sequence current when viewed from a power system point of view. Rather, the "measured" zero-sequence currents also contain positive- and negative-sequence currents. The dominant zero-sequence currents when viewed from a system point (i.e. when looking in from the transformer 102), are the positive-sequence and negative-sequence currents, but when viewed from a feeder point of view these currents may appear as zero-sequence currents. IEDs 104, 106, and 108 may each see only the portion of the cross-country fault current flowing in a single feeder. As such, from the perspective of any one IED, the conditions created by a cross-country fault may appear to be a single-phase-to-ground fault instead of a cross-country fault.

The zero-sequence voltage that drives the capacitive currents shown in FIG. 1 is due to the cross-country fault; however, since Phase B and Phase C are grounded, the capacitive current only flows through the A-phase (i.e., the un-faulted phase) in the un-faulted feeders.

In various embodiments, IEDs 104, 106, and 108 may be configured to analyze the voltages and/or currents in Feeder 1, Feeder 2, and Feeder X, respectively, to detect conditions indicative of a cross-country fault. In some embodiments, IEDs 104, 106, and 108 may be configured to evaluate specific criteria illustrated in FIG. 2A and FIG. 2B and discussed in greater detail below. Upon detection of a cross-country fault, one or more of IEDs 104, 106, and/or 108 may implement a control action to clear the fault. Specifically, IEDs 104, 106, and/or 108 may actuate a breaker 122, 124, and 126, respectively, to electrically disconnect a feeder affected by the cross-country fault from transformer 102. Still further, IEDS 104, 106, and/or 108 may allow a user to specify various parameters associated with the criteria for detection of cross-country faults. Such parameters are illustrated in illustrated in FIG. 2A and FIG. 2B and are discussed in greater detail below.

Figure 2A:
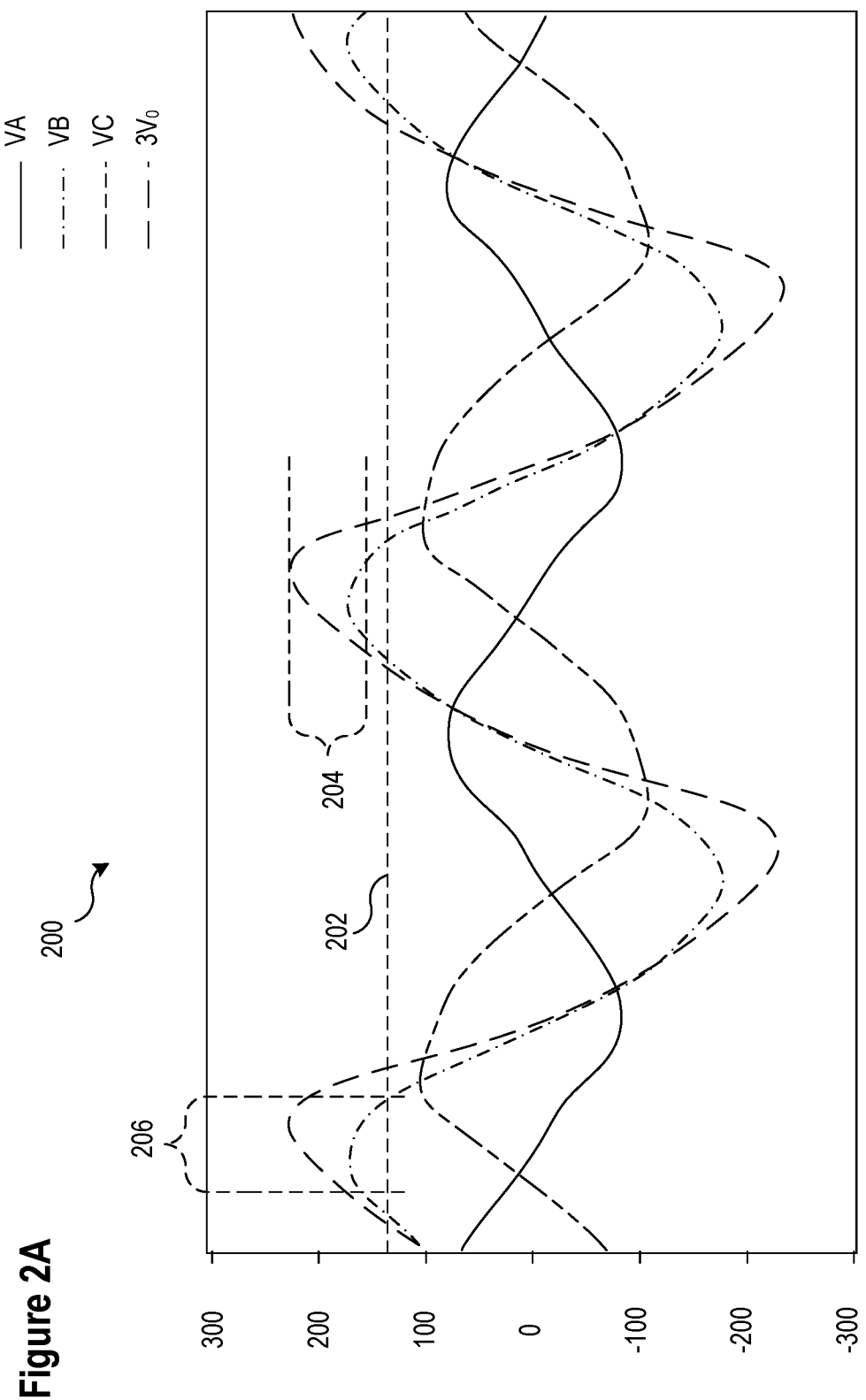
FIG. 2A illustrates plot over time of three voltages in a three-phase electric power system experiencing a cross-country fault, along with various thresholds for detection of the fault consistent with embodiments of the present disclosure.

FIG. 2A illustrates plot 200 over time of three voltages in a three-phase system experiencing a cross-country fault, along with various thresholds for detection of the fault consistent with embodiments of the present disclosure. Plot 200 illustrates the voltages associated with an A, B, and C phase in the three-phase system, along with the zero-sequence voltage, $3V_0$. The zero-sequence voltage, $3V_0$, may be calculated using Eq. 1.

$$3V_0 = V_A + V_B + V_c \quad \text{Eq.1}$$

Still further, some embodiments may monitor multiple electrical parameters (e.g., both current values and voltage values).

Three criteria 202, 204, and 206 are illustrated graphically in FIG. 2A and may be used to identify a cross-country fault by systems and methods consistent with the present disclosure. Criteria 202 is a voltage magnitude. In a cross-country fault, the voltages of two of the three phases are affected. Accordingly, one criteria comprises determining that only one phase voltage magnitude is higher than a voltage magnitude specified by criteria 202. The phase with a magnitude that exceeds the voltage magnitude threshold specified by criteria 202 is the un-faulted phase, which is Phase B in the illustrated embodiment.

Criteria 204 is a comparison of the magnitude of the voltage of the un-faulted phase to the magnitude of the zero-sequence voltage, $3V_0$. The comparison may represent a percentage of the maximum value of the zero-sequence voltage, $3V_0$. In some embodiments, the specific percentage of the zero-sequence voltage, $3V_0$, may be a value set by an operator of an electric power system. In one specific embodiment, the threshold value may be approximately 75% of the maximum of the zero-sequence voltage, $3V_0$. Of course, other specific values are also contemplated.

Criteria 206 may comprise an angle range threshold between the zero-sequence voltage, $3V_0$, and the un-faulted phase. In some embodiments, the specific angle range may be a value set by an operator of an electric power system. In one specific embodiment, the angle range may be approximately 40°, or ±20°. Of course, other specific values are also contemplated.

Figure 2B:
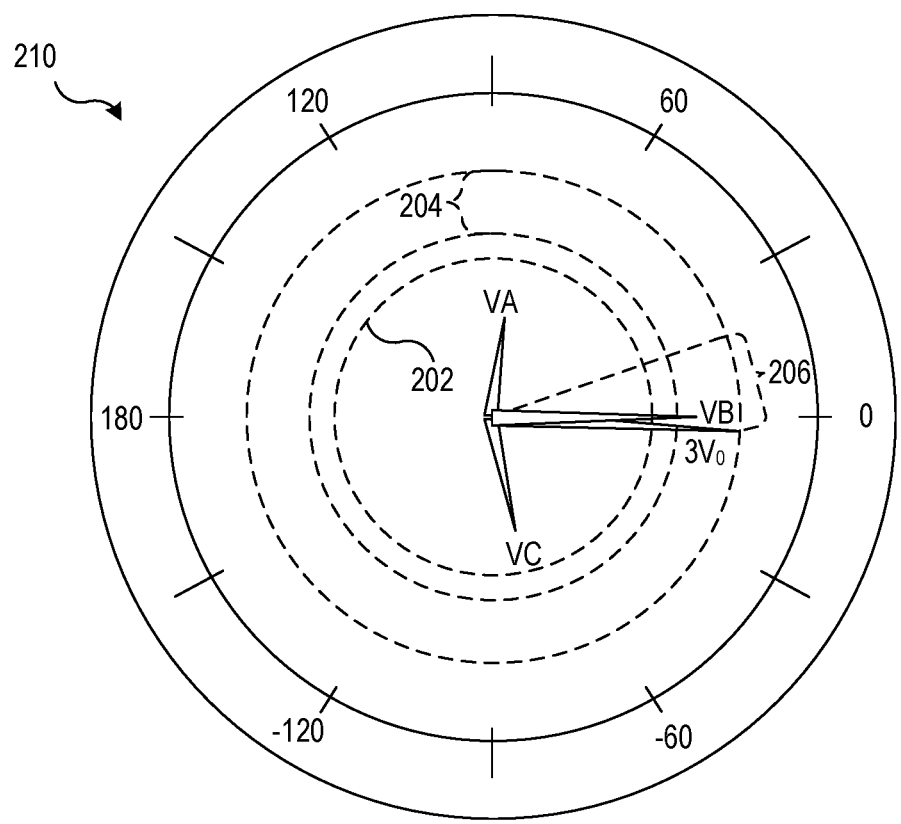
FIG. 2B illustrates a phasor representation of three voltages in a three-phase electric power system experiencing a cross-country fault, along with various thresholds for detection of the fault consistent with embodiments of the present disclosure.

FIG. 2B illustrates a phasor representation 210 of three voltages in a three-phase electric power system experiencing a cross-country fault, along with various thresholds for detection of the fault consistent with embodiments of the present disclosure. Like FIG. 2A, the three criteria 202, 204, and 206 are illustrated graphically and may be used to identify a cross-country fault by systems and methods consistent with the present disclosure.

Figure 3:
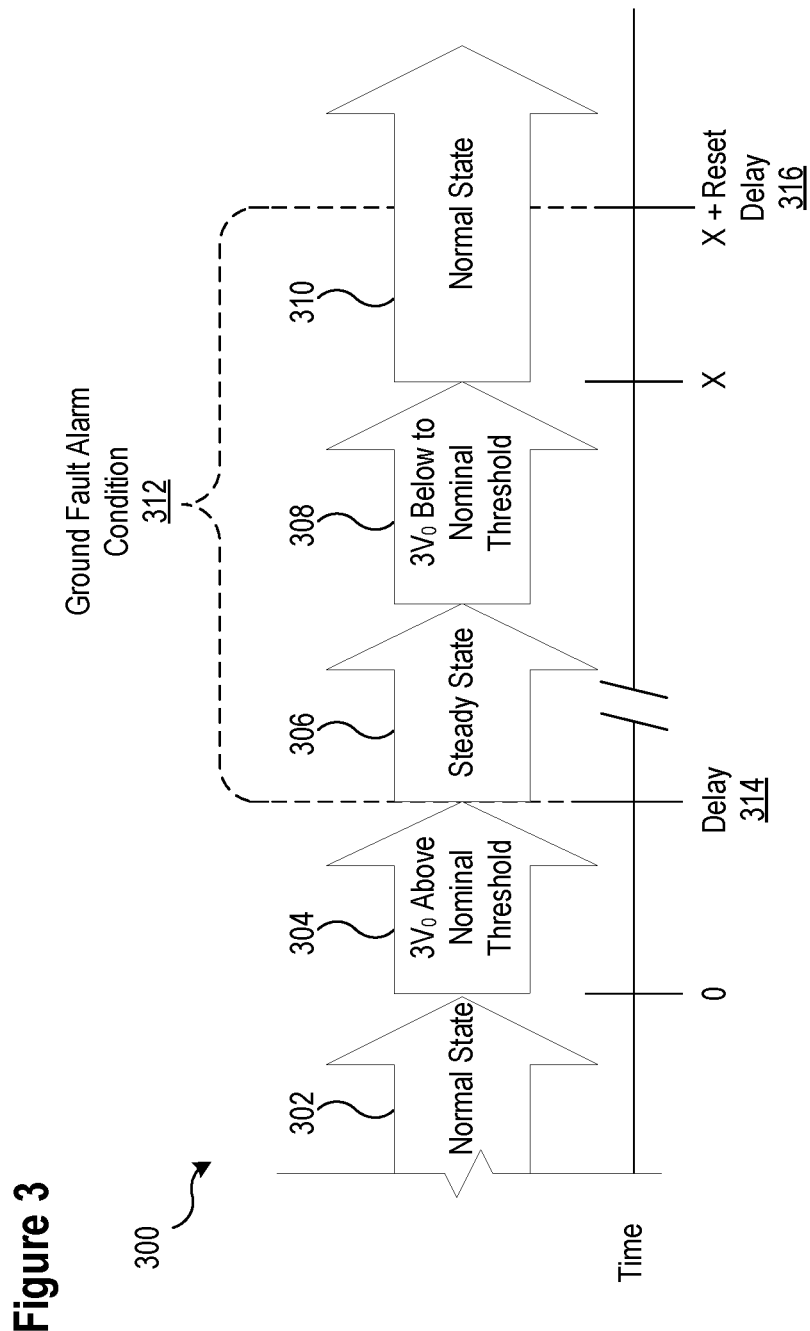
FIG. 3 illustrates a conceptual representation of a timing scheme that may be used to detect cross-country faults consistent with embodiments of the present disclosure.

FIG. 3 illustrates a conceptual representation of a timing scheme 300 that may be used to detect cross-country faults consistent with embodiments of the present disclosure. Time is represented along the x-axis. At time "0," conditions may change from a normal state 302 to a condition in which the zero-sequence voltage, $3V_0$, rises above a nominal threshold 304. A ground fault alarm condition 312 may be triggered if the zero-sequence voltage, $3V_0$, remains above the nominal threshold for a specified delay 314. In some embodiments, the delay 314 may be determined based on a user-provided setting.

In some embodiments, the ground fault alarm condition 312 may enable protective action based on detection of a cross-country fault based on the criteria described herein. In other words, protective actions based on a cross-country fault may be suppressed if the ground fault alarm condition 312 is not active. Still further, the ground fault alarm condition 312 may be used to enable protective action based on single-phase-to-ground faults. In one specific embodiment, protective actions associated with a single-phase-toground fault may be suppressed based on detection of conditions associated with a cross-country fault.

In the illustrated embodiment, the ground fault alarm condition 312 may be maintained during a steady state period 306 while the zero-sequence voltage, $3V_0$, remains above the nominal threshold. The zero-sequence voltage, $3V_0$, falls below the nominal threshold 308 at time "X," but the ground fault alarm condition 312 may remain asserted until a reset delay 316 passes. In other words, the ground fault alarm condition 312 may remain asserted during a normal state 310 for a period of time equal to the reset delay 316. Upon expiration of the reset delay 316, the ground fault alarm condition 312 may be de-asserted.

Figure 4:
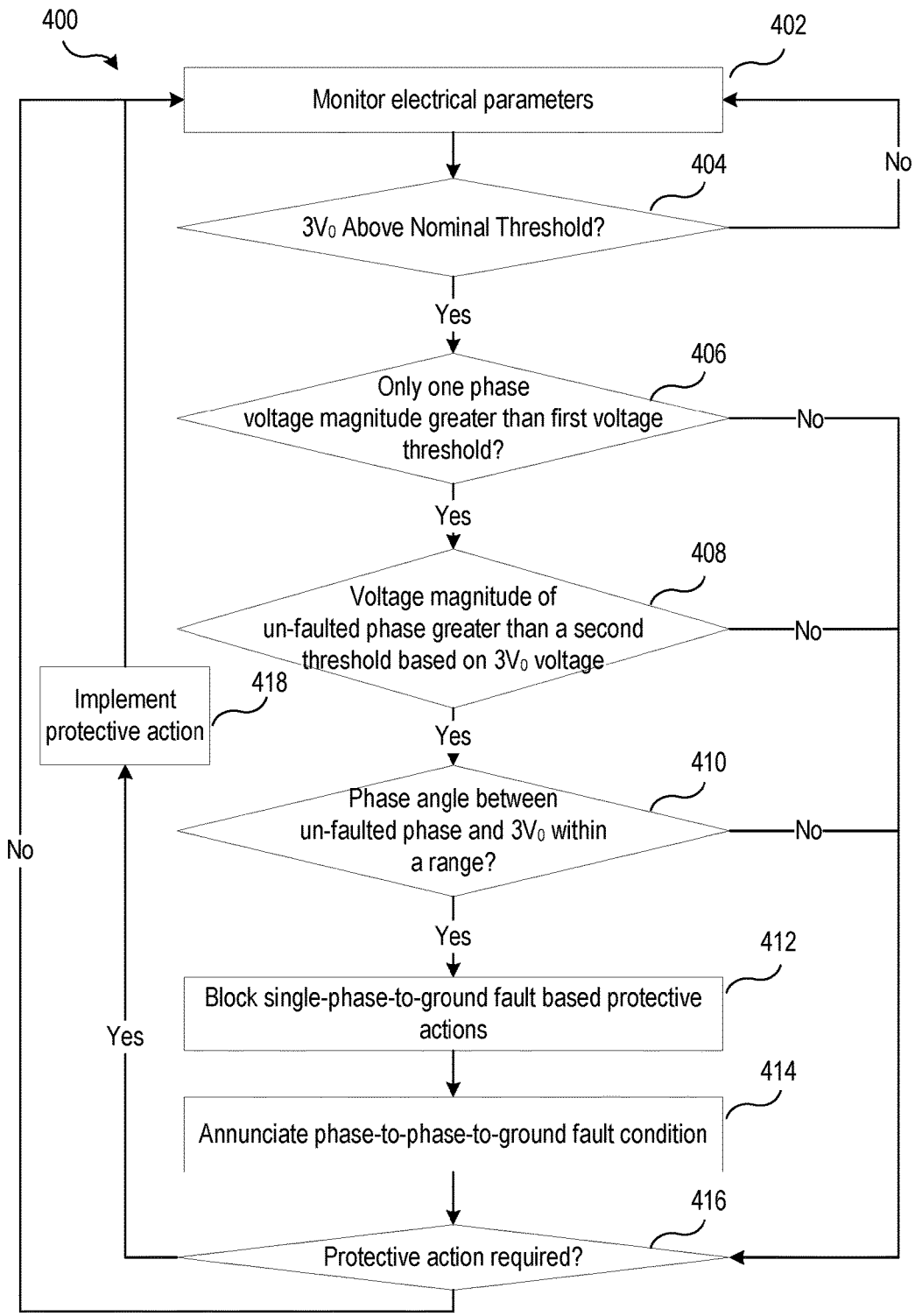
FIG. 4 illustrates a flow chart of a method for detecting a cross-country fault consistent with embodiments of the present disclosure.

FIG. 4 illustrates a flow chart of a method 400 for detecting a cross-country fault consistent with embodiments of the present disclosure. At 402, a system implementing method 400 may monitor electrical parameters in at least a portion of an electric power system. Based on the electrical parameters, method 400 may determine whether the zero-sequence voltage, $3V_0$, exceeds a nominal threshold at 404. In some embodiments, such as the embodiment illustrated in FIG. 3, a delay may be imposed, such that the zero-sequence voltage, $3V_0$, must remain above the nominal threshold for a period of time exceeding the delay. If the zero-sequence voltage, $3V_0$, remains below the nominal threshold, method 400 may return to 402.

If the zero-sequence voltage, $3V_0$, exceeds the nominal threshold, method 400 may determine whether only one phase has a voltage magnitude greater than the first voltage threshold at 406. As discussed above, a cross-country fault may reduce the voltage of two phases, and as such, the un-faulted phase would have the greatest magnitude. In one specific embodiment, the first voltage threshold corresponds to criteria 202, as illustrated in FIG. 2A and FIG. 2B. If the voltage magnitude of only one phase is not greater than the first voltage threshold, method 400 may proceed to 416.

If the voltage magnitude of only one phase is greater than the first voltage threshold, method 400 may determine whether the voltage magnitude of the un-faulted phase is greater than a second threshold based on the zero-sequence voltage, $3V_0$, at 408. In some embodiments, the second threshold may be determined based on a fixed percentage of the maximum value of the zero-sequence voltage, $3V_0$. In one specific embodiment, the second threshold based on the zero-sequence voltage, $3V_0$, corresponds to criteria 204, as illustrated in FIG. 2A and FIG. 2B. If the voltage magnitude of the un-faulted phase is not greater than the second threshold, method 400 may proceed to 416.

If the voltage magnitude of the un-faulted phase is greater than the second threshold, method 400 may determine whether a phase angle between the un-faulted phase and the zero-sequence voltage, $3V_0$, is within a range. In some embodiments, the phase angle range may be specified by a user or may be based on a user-provided setting. In one specific embodiment, the phase angle range corresponds to criteria 206, as illustrated in FIG. 2A and FIG. 2B. If the phase angle between the un-faulted phase and the zero-sequence voltage, $3V_0$, is outside of the range, method 400 may proceed to 416.

If the conditions specified at 406, 408, and 410 are satisfied, a single-phase-to-ground fault-based protective action may be blocked at 412. The criteria evaluated at 406, 408, and 410 are indicative of a cross-country condition, and as such, single-phase-to-ground fault-based protective actions may fail to properly identify the faulted feeder.

At 414, a cross-country fault condition may be annunciated. The annunciation may be transmitted to supervisory systems, such as a Supervisory Control and Data Acquisition ("SCADA") system or a Wide-Area Situational Awareness ("WASA") system. Further, the conditions may be logged for post-event analysis.

At 416, method 400 may determine whether protective action is required. An assessment of whether protective action is required may be based on whether a fault is a single-phase-to-ground fault or a cross-country fault. If protective action is not required, method 400 may return to 402. If protective action is required, a protective action may be implemented at 418. In some embodiments, the protective action may comprise opening a breaker to clear the fault.

Figure 5:
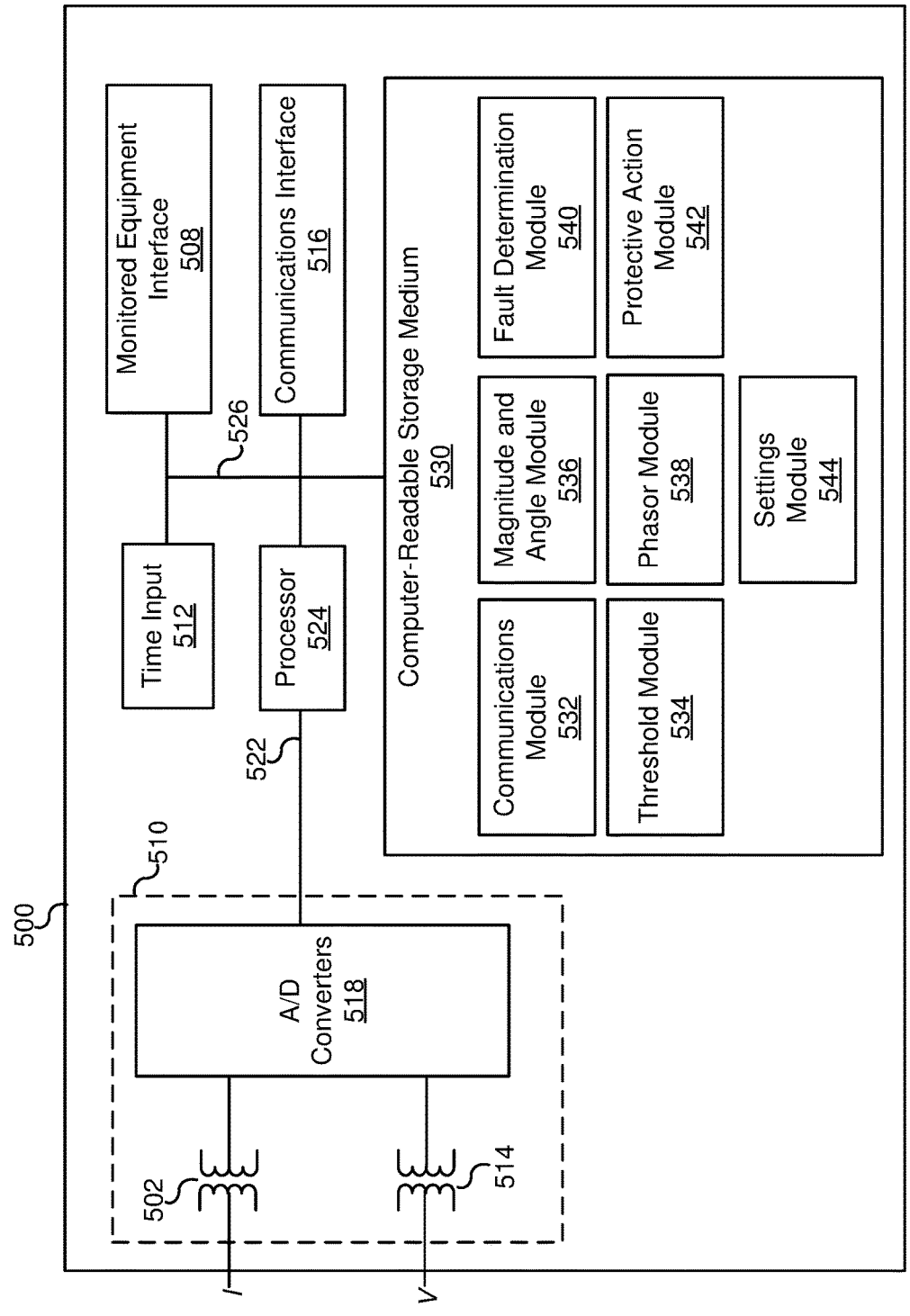
FIG. 5 illustrates a functional block diagram of a system for detecting phase-to-phase-to ground faults consistent with embodiments of the present disclosure.

FIG. 5 illustrates a functional block diagram of a system 500 for detecting faults in an electrical distribution system consistent with embodiments of the present disclosure. In certain embodiments, the system 500 may comprise an IED system configured to, among other things, determine a faulted feeder in an electric power distribution system. System 500 may be implemented in an IED using hardware, software, firmware, and/or any combination thereof. Moreover, certain components or functions described herein may be associated with other devices or performed by other devices. The specifically illustrated configuration is merely representative of one embodiment consistent with the present disclosure.

System 500 includes a communications interface 516 configured to communicate with other IEDs and/or system devices. In certain embodiments, the communications interface 516 may facilitate direct communication with another IED or communicate with another IED over a communications network. Communications interface 516 may facilitate communications with multiple IEDs. System 500 may further include a time input 512, which may be used to receive a time signal (e.g., a common time reference) allowing system 500 to apply a time-stamp to the acquired samples. In certain embodiments, a common time reference may be received via communications interface 516, and accordingly, a separate time input may not be required for time-stamping and/or synchronization operations. One such embodiment may employ the IEEE 1588 protocol. A monitored equipment interface 508 may be configured to receive status information from, and issue control instructions to, a piece of monitored equipment (such as a circuit breaker, conductor, transformer, or the like).

Processor 524 may be configured to process communications received via communications interface 516, time input 512, and/or monitored equipment interface 508. Processor 524 may operate using any number of processing rates and architectures. Processor 524 may be configured to perform various algorithms and calculations described herein. Processor 524 may be embodied as a general-purpose integrated circuit, an application-specific integrated circuit, a field-programmable gate array, and/or any other suitable programmable logic device.

In certain embodiments, system 500 may include a sensor component 510. In the illustrated embodiment, sensor component 510 is configured to gather data directly from a conductor (not shown) and may use, for example, transformers 502 and 514 and A/D converters 518 that may sample and/or digitize filtered waveforms to form corresponding digitized current and voltage signals provided to data bus 522. A/D converters 518 may include a single A/D converter or separate A/D converters for each incoming signal. A current signal may include separate current signals from each phase of a three-phase electric power system. A/D converters 518 may be connected to processor 524 by way of data bus 522, through which digitized representations of current and voltage signals may be transmitted to processor 524. In various embodiments, the digitized current and voltage signals may be used to calculate the location of a fault on a feeder as described herein.

A computer-readable storage medium 530 may be the repository of various software modules configured to perform any of the methods described herein. A data bus 526 may link monitored equipment interface 508, time input 512, communications interface 516, and computer-readable storage medium 530 to processor 524.

Communications module 532 may be configured to allow system 500 to communicate with any of a variety of external devices via communications interface 516. Communications module 532 may be configured for communication using a variety of data communication protocols (e.g., Ethernet, IEC 61850, etc.).

A phasor module 538 may be configured to generate a phasor from a plurality of measurements of electrical parameters. According to one specific embodiment, phasor module 538 may be configured to generate a phasor representation similar to the representation illustrated in FIG. 2B.

A magnitude and angle module 536 may be configured to determine magnitude values associated with various measurements associated with electrical characteristics of an electric power delivery system. Exemplary electrical characteristics may include, for example, voltages, currents, phases, etc. For example, magnitude and angle module 536 may be configured to determine the magnitude and angle of a plurality of measurements received from sensor component 510. Magnitude and angle module 536 may further be configured to identify the largest measurements in a group of measurements. In one specific embodiment, magnitude and angle module 536 may be configured to evaluate the criteria illustrated graphically in FIG. 2A and FIG. 2B.

A fault determination module 540 may be configured to implement a method consistent with the present embodiment for identifying a fault. According to one specific embodiment, fault determination module 540 may implement method 500, as illustrated in FIG. 5.

A settings module 544 may be configured to control various thresholds and settings associated with the detection of faults in an electric power system. In some embodiments, the settings module may be configured to permit users to specify certain settings, and/or to calculate settings based on user-provided values. In some specific embodiments, a user may specify a voltage threshold based on a zero-sequence voltage, $3V_0$, a delay associated with a ground fault alarm condition, etc.

A protective action module 542 may be configured to implement a protective action based on the fault determination module 540. In various embodiments, a protective action may include tripping a breaker, selectively isolating a portion of the electric power system, etc. In various embodiments, the protective action module 542 may coordinate protective actions with other devices or systems in communication with system 500. The protective action may be communicated via a monitored equipment interface 508 for implementation by an appropriate device.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may not include long-distance transmission of high-voltage power. Moreover, principles described herein may also be utilized for protecting an electrical system from over-frequency conditions, wherein power generation would be shed rather than load to reduce effects on the system. Accordingly, many changes may be made to the details of the above-described embodiments without departing from the underlying principles of this disclosure. The scope of the present invention should, therefore, be determined only by the following claims.

What is claimed is:

1. A system configured to detect a cross-country fault in an electric power system, comprising:
   a data acquisition subsystem configured to receive a plurality of representations of electrical conditions associated with at least a portion of the electric power system;
   a magnitude and angle subsystem configured to:
      identify a first condition comprising a voltage magnitude of one phase exceeding a first voltage threshold based on the plurality of representations of electrical conditions;
      identify the one phase that exceeds the first voltage threshold as an un-faulted phase;
      identify a second condition comprising the voltage magnitude of the un-faulted phase exceeding a second threshold based on a zero-sequence voltage based on the plurality of representations of electrical conditions;
      identify a third condition comprising a phase angle between the un-faulted phase and the zero-sequence voltage being within a range based on the plurality of representations of electrical conditions;
   a fault determination module configured to:
      identify a cross-country fault condition based on identification of the first condition, the second condition, and the third condition by the magnitude and angle subsystem;
      annunciate the cross-country fault condition;
   a protective action module configured to implement a protective action to clear the cross-country fault condition.

2. The system of claim 1, wherein the magnitude and angle subsystem is further configured to determine that the zero-sequence voltage exceeds a nominal threshold.

3. The system of claim 2, wherein the magnitude and angle subsystem is further configured to:
   determine that the zero-sequence voltage has exceeded the nominal threshold for a delay period; and
   assert a ground fault alarm condition after the delay.

4. The system of claim 3, wherein the magnitude and angle subsystem is further configured to:
   determine that the zero-sequence voltage has fallen below the nominal threshold for a reset period; and
   de-assert the ground fault alarm condition after the reset period.

5. The system of claim 1, wherein the protective action module is further configured to block a single-phase-to-ground protective action based on identification of the cross-country fault condition.

6. The system of claim 1, further comprising a settings subsystem configured to receive a first user-provided value and to calculate the second threshold based on and a maximum value of the zero-sequence voltage.

7. The system of claim 1, further comprising a settings subsystem configured to receive a second user-provided value and to calculate the range.

8. The system of claim 1, wherein the electrical power system is ungrounded.

9. The system of claim 1, further comprising a monitored equipment interface configured to issue the control instruction to monitored equipment.

10. The system of claim 1, further comprising a communications interface configured to annunciate the cross-country fault.

11. The system of claim 10, wherein the communications interface is configured to annunciate the cross-country fault condition to a Supervisory control and data acquisition.

12. A method for detecting a cross-country fault in a multi-phase electrical power system, the method comprising:
    identifying a first condition comprising a voltage magnitude of one phase exceeding a first voltage threshold based on the plurality of representations of electrical conditions;
    identifying the one phase that exceeds the first voltage threshold as an un-faulted phase;
    identifying a second condition comprising the voltage magnitude of the un-faulted phase exceeding a second threshold based on a zero-sequence voltage based on the plurality of representations of electrical conditions;
    identifying a third condition comprising a phase angle between the un-faulted phase and the zero-sequence voltage being within a range based on the plurality of representations of electrical conditions;
    identifying a cross-country fault condition based on identification of the first condition, the second condition, and the third condition by the magnitude and angle subsystem;
    annunciating the cross-country fault condition;
    implementing a protective action to clear the cross-country fault condition.

13. The method of claim 12, further comprising:
    determining that the zero-sequence voltage exceeds a nominal threshold.

14. The method of claim 12, further comprising:
    determining that the zero-sequence voltage has exceeded the nominal threshold for a delay period; and
    asserting a ground fault alarm condition after the delay.

15. The method of claim 14, further comprising:
    determining that the zero-sequence voltage has fallen below the nominal threshold for a reset period; and
    de-asserting the ground fault alarm condition after the reset period.

16. The method of claim 12, further comprising:
    blocking a single-phase-to-ground protective action based on identification of the cross-country fault condition.

17. The method of claim 12, further comprising:
    calculating the second threshold based on a first user-provided value and a maximum value of the zero-sequence voltage.

18. The method of claim 12, wherein the range is determined based on a second user-provided value.

19. The method of claim 12, wherein the electrical power system is ungrounded.

20. The method of claim 12, wherein annunciating a cross-country fault condition comprises one of communicating the condition and logging the condition in an event report.

* * * * *